US007821293B2

(12) United States Patent
Fazzi et al.

(10) Patent No.: US 7,821,293 B2
(45) Date of Patent: Oct. 26, 2010

(54) ASYNCHRONOUS INTERCONNECTION SYSTEM FOR 3D INTERCHIP COMMUNICATION

(75) Inventors: Alberto Fazzi, Eindhoven (NL); Luca Ciccarelli, Rimini (IT); Luca Magagni, Bologna (IT); Roberto Canegallo, Rimini (IT); Roberto Guerrieri, Bologna (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 219 days.

(21) Appl. No.: 12/006,102

(22) Filed: Dec. 28, 2007

(65) Prior Publication Data
US 2008/0225987 A1    Sep. 18, 2008

(30) Foreign Application Priority Data
Dec. 29, 2006    (EP) .................................. 06027047

(51) Int. Cl.
*H03K 19/003* (2006.01)
(52) U.S. Cl. ......................................... 326/34; 326/33
(58) Field of Classification Search .................. 326/21, 326/30–31, 33–34
See application file for complete search history.

(56) References Cited

U.S. PATENT DOCUMENTS

| | | | |
|---|---|---|---|
| 4,723,082 A * | 2/1988 | Asano et al. .................. 326/81 |
| 5,220,205 A * | 6/1993 | Shigehara et al. ........... 327/198 |
| 5,629,838 A | 5/1997 | Knight et al. | |
| 5,760,618 A * | 6/1998 | Deliyannides et al. ...... 327/108 |
| 6,016,064 A * | 1/2000 | Saeki ........................... 326/121 |
| 6,600,325 B2 | 7/2003 | Coates et al. | |

OTHER PUBLICATIONS

Kaustav Banerjee, Shukri J. Souri, Pawan Kapur, and Krishna C. Saraswat, "3-D ICs: A Novel Chip Design for Improving Deep-Submicrometer Interconnect Performance and Systems-on-Chip Integration", Proceedings of the IEEE, May 2001, pp. 602-633, vol. 89, No. 5.

(Continued)

*Primary Examiner*—James Cho
(74) *Attorney, Agent, or Firm*—Lisa K. Jorgenson; Kevin D. Jablonski; Graybeal Jackson LLP

(57) ABSTRACT

An embodiment of the present invention relates to a asynchronous interconnection system comprising a transmitter circuit and a receiver circuit inserted between inserted between respective first and second voltage references and having respective transmitter and receiver nodes coupled in a capacitive manner. The receiver circuit comprises: a recovery stage inserted between the first and second voltage references of the receiver circuit and connected to the receiver node; and a state control stage, in turn inserted between the first and second voltage references of the receiver circuit connected to the recovery stage correspondence with a first feedback node providing a first control signal and having a second feedback node connected in a feedback manner to the recovery stage. The recovery stage comprises a first feedback loop connected to the first feedback node and acting in such a way to recover a received voltage signal and a feedback loop connected to the second feedback node of the state control stage and acting in such a way to deactivate the recovery feedback on the receiver node and guarantee that the receiver node is let in a high impedance state.

59 Claims, 2 Drawing Sheets

OTHER PUBLICATIONS

Kouichi Kanda, Danardono Dwi Antono, Koichi Ishida, Hiroshi Kawaguchi, Tadahiro Kuroda', and Takayasu Sakurai, "1.27Gb/s/pin 3mW/pin Wireless Superconnect (WSC) Interface Scheme", ISSCC Dig. Tech. Papers, Feb. 2003, pp. 186-187.

Robert J. Drost, Robert David Hopkins, Ron Ho, and Ivan E. Sutherland, "Proximity Communication", IEEE Journal of Solid-State Circuits, Sep. 2004, pp. 1529-1535, vol. 39, No. 9.

Stephen Mick, John Wilson and Paul Franzon, "4 Gbps High-Density AC Coupled Interconnection", CICC2002, IEEE 2002 Custom Integrated Circuits Conference, pp. 133-140.

Lei Luo, John M. Wilson, Stephen E. Mick, Jian Xu, Liang Zhang, and Paul D. Franzon, "3Gb/s AC-Coupled Chip-to-Chip Communication using a Low-Swing Pulse Receiver", ISSCC2005, pp. 522, 523, 614.

* cited by examiner

ASYNCHRONOUS INTERCONNECTION SYSTEM FOR 3D INTERCHIP COMMUNICATION

PRIORITY CLAIM

This application claims priority from European patent application No. 06027047.7, filed on Dec. 29, 2006.

TECHNICAL FIELD

An embodiment of the present invention relates to an asynchronous interconnection system for 3D inter-chip communication.

More specifically, an embodiment of the invention relates to an asynchronous interconnection system comprising a transmitter circuit and a receiver circuit inserted between a first and a second voltage reference and having respective transmitter and receiver nodes coupled in a capacitive manner.

An embodiment of the invention particularly, but not exclusively, relates to a chip-to-chip communication system for stacked device, i.e., a device comprising at least two chips assembled in a three-dimensional (3D) stacking configuration and the following description is made with reference to this field of application for convenience of explanation only.

BACKGROUND

The development of stacking technology for heterogeneous device integration has recently increased in importance.

Stacking of chips, in which two or more integrated circuits or ICs of different types are placed one on the top of the other in a same package, is an alternative to silicon integration and provides improvements at the system design level in terms of size, cost, speed, power consumption and ease of application for a wide variety of products.

In this field, the development of enhanced 3D interconnection systems is a process in order to enlarge the design space in new technologies implementation: having efficient and flexible vertical interconnection is often a requirement in order to be able to get new design guidelines about global nets optimization and chip partitioning. This is also a feature to be guaranteed in stacked devices in the scenario of the so-called Systems-on-Chip and Systems-in-Package.

In fact, stacking integrated circuits or silicon structures inside a same package and making them communicate may enhance the performance of a digital system comprising such structures as a whole, as described in the article to K. Banerjee et al.: "3-D ICs: A Novel Chip Design for Improving Deep-Submicrometer Interconnect Performance and Systems-on-Chip Integration", Proceedings of the IEEE, 89(5):602-633, May 2001, which is incorporated by reference.

Moreover, vertical data communication using AC wireless interconnect has been recently presented as a very promising stacking or 3D technology for high-bandwidth, high speed applications, as described in the article to Kanda K. et al. entitled "1.27 Gb/s/pin 3 mW/pin wireless superconnect wsc interface scheme", ISSCC Dig. Tech. Papers, pp. 186-187, February 2003, which is incorporated by reference.

The known chip-to-chip vertical communication systems, as the ones described in the above referenced articles, are based on contactless 10 schemes exploiting capacitive coupling as an inter-chip channel. In particular, an upper metal layer of the technology process in which the system is manufactured is used to form a capacitive channel, as shown for instance in FIG. 1, a known type of chip-to-chip vertical communication system being globally indicated at 1 and hereinafter called briefly the system 1.

As shown in FIG. 1, the system 1 comprises a plurality of communication units 2, each comprising a transmitter 3 and a receiver 4.

In particular, the transmitter 3 resides on a first chip A and the receiver 4 resides on a second chip B, the first and second chips A and B being assembled in a stacked or 3D configuration, the first chip A being on the top of the second chip B and the transmitter 3 and the receiver 4 being positioned on respective facing surfaces of the chips A and B, more particularly chip A is face-down while chip B is face-up, with reference to an XYZ axis-system as shown in FIG. 1. The above configuration (transmitter 3-chip A; receiver 4-chip B) is considered only as an example, a reverse configuration (transmitter 3-chip B; receiver 4-chip A) being also possible, the same consideration applying.

The system 1 also comprises I/O interfaces 5 on both chips A and B.

Advantages of a 3D AC interconnection between chips, as the one illustrated in FIG. 1 are:

The interconnections are not based on DC contacts, and thus they are often highly reliable with respect to microbus or others DC connections;

there is often no need of using a protection circuit against electrostatic discharges (ESD);

the system 1 shows parasitic elements having reduced values; and the system 1 has a great scalability.

However, it may need an on-chip communication system should be also able to guarantee high performance, low power dissipation, reliability, and flexibility in data exchange for being useful in the majority of applications.

For complying with these requirements, major issues are about designing general purpose connections with good timing performances, and with low power consumption, comparable for instance with the ones related to on-chip global nets.

In this aim, an asynchronous capacitive interconnection system is more general with respect to a synchronous one, having:

a greater generality, since asynchronous signals and synchronous ones could be propagated with the same communication systems; and a greater efficiency, since no dedicated clock tree is needed, avoiding the related power consumption and synchronization constraints.

However, it should be reminded that a main issue about asynchronous capacitive interconnection systems remains, the minimization of power consumption.

Through capacitive elements such as the capacitive channel between transmitter 3 and receiver 4 in a system 1 like the one shown in FIG. 1, only AC signal components are transmitted. Thu, when a voltage transition occurs on an electrode of the transmitter 3, the voltage swing is propagated to an electrode of the receiver 4, with an attenuation that depends on the ratio between inter-electrode coupling and the input capacitive load related to the receiver 4. This behaviour of a capacitive transmission channel is shown for instance in FIG. 2 by means of a channel model, globally indicated by 6. In particular, the channel model 6 comprises a channel capacitor Ccc inserted between a first or transmitter node TX and a second or receiver node RX. Moreover, Ctx and Crx are the capacitive coupling to the voltage reference (here ground GND) of transmitter and receiver nodes. Due to this attenuation, the design of the receiver circuit is important. For example, if the attenuation is significant the receiver may require a high-gain, and this may require spending a lot of power consumption for biasing the circuit. On the other hand, the reduction of power consumption for asynchronous communication circuits usually implies a worst-case sensitivity and thus a large area for the electrodes.

Many architectures have been proposed for implementing an interconnection system and/or a receiver circuit thereof.

Such known architectures are described, for instance, in the article to R. Drost et al. entitled: "Proximity Communication", CICC2003, to S. Mick et al. entitled: "4 Gbps High-Density AC Coupled Interconnection", CICC2002 and in the article to Luo et al. entitled: "3 Gbps AC-Coupled Chip-to-Chip Communication Using a Low-Swing Pulse Receiver", ISSCC2005, which are incorporated by reference.

Other interconnection systems are described in the U.S. Pat. Nos. 6,600,325 and 5,629,838, which are incorporated by reference.

These known solutions may have a power-consumption vs. electrode-area trade-off in the design of the receiver element.

SUMMARY

An embodiment of the present invention is an asynchronous interconnection system for 3D inter-chip communication, having structural and functional characteristics which overcome some or all of the limitations which may still affect the systems realized according to the prior art.

An embodiment of the present invention associates with a transmitter circuit realized by means of a simple buffer a receiver circuit comprising a double feedback loop in order to reconstruct a received voltage signal and, at the same time, to provide a receiver node at a high impedance state.

BRIEF DESCRIPTION OF THE DRAWINGS

Characteristics and advantages of an asynchronous interconnection system according to one or more embodiments of the invention will be apparent from the following thereof given by way of indicative and non limiting example with reference to the annexed drawings.

In the drawings.

DETAILED DESCRIPTION

Figure 3:
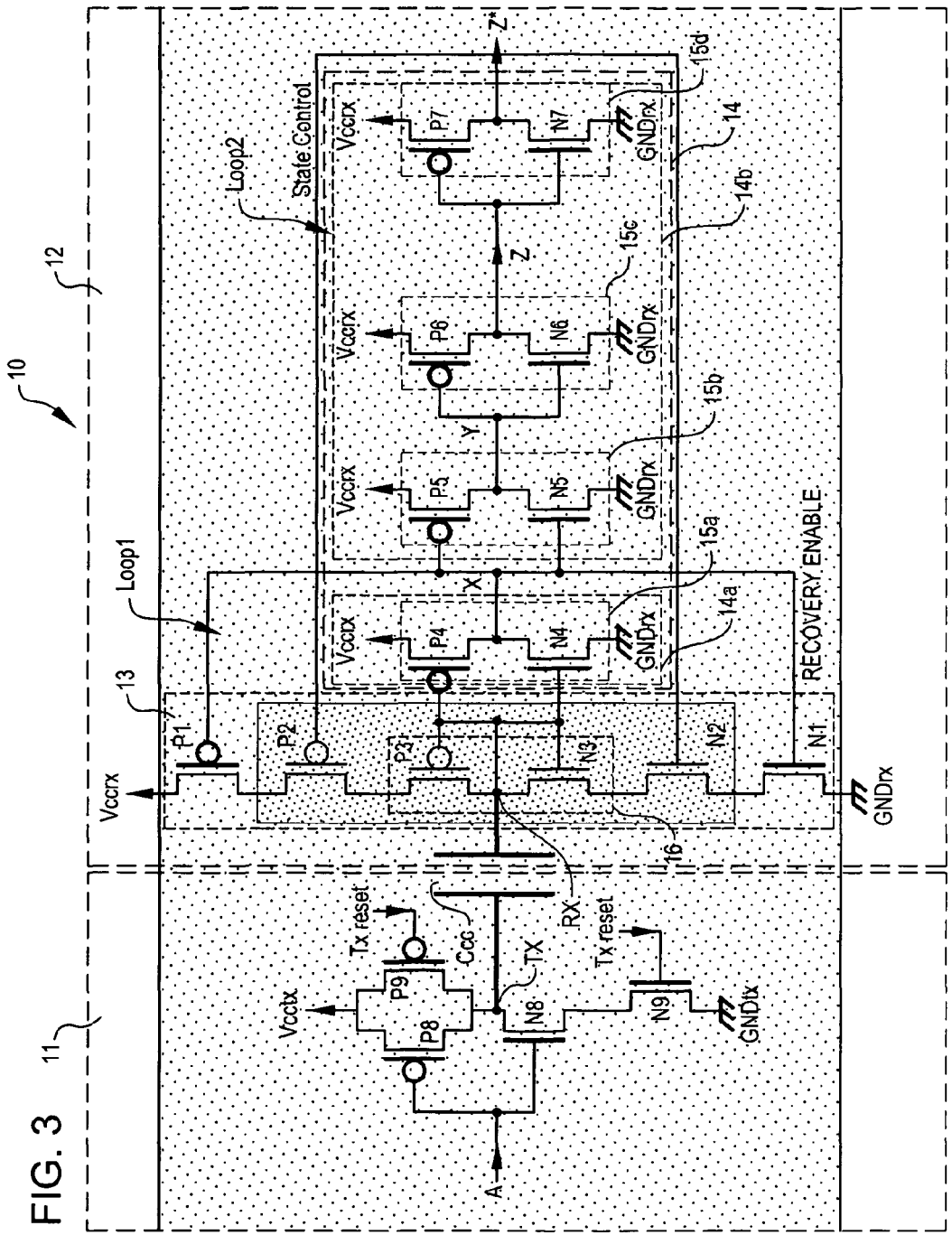
FIG. 3 shows an asynchronous interconnection system according to an embodiment of the present invention.

An asynchronous interconnection system is shown in FIG. 3, globally indicated with 10.

The asynchronous interconnection system 10 comprises a transmitter circuit 11 and a receiver circuit 12 coupled in a capacitive manner, as represented by the coupling capacitor Ccc inserted between a transmitter and a receiver node, TX and RX, corresponding to the transmitter and receiver electrodes, respectively.

The receiver circuit 12 comprises a recovery stage 13 inserted between a first and a second voltage reference, in particular a supply voltage reference Vccrx and a ground GNDrx for the receiver circuit 12, and connected to a state control stage 14, in correspondence with a first feedback node X.

The state control stage 14 is in turn inserted between the supply voltage reference Vccrx and ground GNDrx and has a second feedback node Z*.

More particularly, the state control stage 14 comprises a signal amplification stage 14a and a signal recovering stage 14b interconnected at the first feedback node X, the signal recovering stage 14b being further connected to the second feedback node Z*.

As will be clear from the following description of the operation of the asynchronous interconnection system 10 according to an embodiment of the invention, it provides for a double feedback loop on the receiver node RX.

In this way, the proposed asynchronous interconnection system 10 may have a very low power consumption along with high performance functionality.

In particular, the recovery stage 13 comprises a first and a second couple of complementary voltage recovery transistors, N1, P1 and N2, P2, respectively, inserted between the supply voltage reference Vcc and ground GND and having their control or gate terminals connected to the first and second feedback nodes, X and Z*, respectively, to form a bistable element.

More particularly, the recovery stage 13 comprises a first and a second voltage recovery transistor of the PMOS type, P1 and P2, inserted, in series to each other, between the supply voltage reference Vccrx and the receiver node RX as well as a first and a second voltage recovery transistor of the NMOS type, N1 and N2, inserted, in series to each other, between the receiver node RX and ground GNDrx.

The first PMOS transistor P1 and the first NMOS transistor N1 have respective control or gate terminals connected to each other and to the first feedback node X, receiving therefrom a first control signal Recovery Enable, while the second PMOS transistor P2 and the second NMOS transistor N2 have respective control or gate terminals connected to each other and to the second feedback node Z*, receiving therefrom a second control signal State Control.

In this way, as will be explained in the following description, the first voltage recovery transistors P1 and N1 realize a first feedback loop, Loop1, which acts in such a way to recover a received voltage signal, and the second voltage recovery transistors P2 and N2 realise a second feedback loop, Loop2, which acts in such a way to deactivate the first loop and use the receiver node RX to be in a high impedance state, ready for a next transmission of signals.

Moreover, the state control stage 14 comprises a plurality of inverters 15 inserted, in cascade to each others, between the first feedback node X and the second feedback node Z* and comprising respective pairs of complementary transistors, i.e., each comprising a first transistor of the PMOS type and a second transistor of the NMOS type connected, in series to each other, between the supply voltage reference Vccrx and ground GNDrx and having common drain terminals connected to intermediate nodes.

In the non-limitative example of FIG. 3, the state control stage 14 comprises a first 15a, a second 15b, a third 15c and a fourth inverter 15d, comprising the complementary transistors P4N4, P5-N5, P6-N6 and P7-N7. The first inverter 15a is connected to the receiver node RX and forms signal amplification stage 14a for the amplification of the voltage signal at the receiver node RX. Moreover, the second, third, and fourth inverters 15b-15d form the signal recovering stage 14b, the fourth inverter 15d being connected to the second feedback node Z*.

It should be remarked that the first inverter 15a could be substituted by an inverting amplification stage.

More particularly, the transistors P4-N4 of the first inverter 15a have control or gate terminals connected to each other and to the receiver node RX and common drain terminals connected to the first feedback node X.

In a similar manner, the transistors P5-N5 of the second inverter 15b have control or gate terminals connected to each other and to the first feedback node X and common drain terminals connected to a first intermediate node Y, while the transistors P6-N6 of the third inverter 15c have control or gate terminals connected to each other and to the first intermediate node Y and common drain terminals connected to a second intermediate node Z.

Furthermore, the transistors P7-N7 of the fourth and final inverter 15d have control or gate terminals connected to each other and to the second intermediate node Z and common drain terminals connected to the second feedback node Z*.

Finally, the receiver circuit 12 further comprises a voltage limiter 16, inserted within the recovery stage 13 and connected to the receiver node RX.

More particularly, the voltage limiter 16 comprises a pair of complementary transistors, P3 and N3, of the PMOS and NMOS type, respectively, inserted between the second voltage recovery transistors P2 and N2 of the recovery stage 13 and connected to the receiver node RX. Moreover the transistors P3 and N3 of the voltage limiter 16 have control or gate terminals connected to the gate terminals of the transistors P4-N4 of the first inverter 15a of the signal amplification stage 14a as well as to the receiver node RX.

It should be noted that the degree of freedom in choosing the transistor type, as provided by the proposed receiver circuit 12 may be of great interest in order to provide an asynchronous interconnection system 10 having a sufficient stability and a low power consumption.

The asynchronous interconnection system 10 further comprises a transmitter circuit 11 realized as a simple buffer stage, in particular a NAND gate inserted between a first and a second voltage reference, in particular a supply voltage reference Vcctx and a ground GNDtx for the transmitter circuit 11.

More particularly, the transmitter circuit 11 comprises a first and a second buffer transistor, P8 and P9, of the PMOS type, inserted, in parallel to each other, between the supply voltage reference Vcctx and the transmitter node TX, as well as a third and a fourth buffer transistor, N8 and N9, of the NMOS type, inserted, in series to each other, between the transmitter node TX and ground GNDtx.

The first and third buffer transistors, P8 and N8, have their control or gate terminals connected to each other and to an input terminal A of the transmitter circuit 11, while the second and fourth buffer transistors, P9 and N9, have their control or gate terminals connected to a transmitter reset terminal and receiving therefrom a reset signal TX reset.

Finally, the asynchronous interconnection system 10 further comprises a biasing stage for providing a reset signal RX reset to a receiver reset terminal of the receiver circuit 12, this biasing stage, reset signal Rx, and receiver reset terminal being omitted from FIG. 3. because they are conventional.

The operation of the receiver circuit 12 according to an embodiment of the present invention is as follows.

When an edge on a voltage signal received on the receiver node RX occurs, the first feedback loop, Loop1 is activated by a transition of control signal Recovery Enable, this switches on the first voltage recovery transistors P1 or N1 (alternatively) and consequently the pull-up (P1, P2, P3) or pull-down (N1, N2, N3) branch of the recovery stage 13 and thus recovering the received voltage signal.

The received voltage signal then propagates through the inverters 15 of the state control stage 14, such inverters 15 acting as delay elements, and reaches the second feedback node Z*. Such a second feedback node Z* switches-off the second voltage recovery transistors P2 or N2 (alternatively) and thus the recovery phase is finally over and the receiver node RX is left in a high impedance state, ready for a next transmission of signals.

In this way, the proposed receiver circuit 12 join a voltage signal recovery performed on the receiver node RX together with a high impedance reception state of the receiver node RX itself, and thus minimizes the power consumption due to static current of the asynchronous interconnection system 10 as a whole, without increasing the area requirement.

In fact, when an edge of a received voltage signal occurs, the voltage recovery paths realized by the recovery stage 13 are always switched-off (transistors N1 and P2 are OFF for a high value of the voltage signal received on the receiver node RX; N2 and P1 are OFF in the dual condition), so there is no opposition to transition on the receiver node RX and the area of the communication electrode corresponding to the receiver node RX could be the minimum required for ensuring the correct switching of the signal amplification stage 14a at each transition.

Also, a proper operation of the receiver circuit 12 according to an embodiment of the present invention is obtained by an accurate sizing of the delay path provided by the state control stage 14.

In this way, the proposed receiver circuit 12 provides a good trade-off between performance and good timing margins for voltage recovery: in case of a large delay, the voltage may be properly recovered on the receiver node RX but the overall communication time may be large; on the other hand, a small delay may reduce the recovery time but may be acceptable only if the amplitude of the voltage at the receiver node RX is large.

Furthermore, for an overall optimization according to an embodiment of the invention, the voltage recovery transistors (N1, N2, P1, P2) are not directly connected to the receiver node RX: they control it through a pair of diode-connected transistors (N3 and P3). This reduces the voltage swing of the receiver node RX from the supply voltage Vcc to a value equal to $Vcc-2V_T$, being $V_T$ the threshold voltage value of a MOS transistor. In particular, when a low voltage value is received on the receiver node RX, it is pulled to a voltage value equal to VT during the recovery of the received voltage signal, while, when an high voltage value is received on the receiver node RX, it is pulled to a voltage value equal to Vcc−VT, thus leading to a smaller sizing of the communication electrode corresponding to the receiver node RX, thanks to the reduction of required voltage transition on such a receiver node RX for a switching of the signal amplification stage 14a.

Moreover, according to an embodiment of the invention, the receiver circuit 12 also has a reduced recovery time, for more optimized performances, without affecting significantly the power consumption of the asynchronous interconnection system 10 as a whole. In fact, the reduced voltage swing on the receiver node RX is enough to switch-off the inverters of the state control stage 14 of the receiver circuit 12 and the reduced recovery voltages are generated without static power consumption.

Furthermore, N3 and P3 may also provide for a reduced coupling between feed-back signals and the receiver node RX, thus reducing significantly glitches on such a receiver node RX and preventing performance and functional degradation during a recovery of the received voltage signal.

Moreover, by using VTL transistors for the voltage limiter 16, a sufficient cut-off of the inverters 15 connected thereto (comprising VTH transistors) may be ensured.

In fact, the receiver node RX swing from VTL to Vcc−VTL, thus driving the first inverter 15a avoiding static power consumption and reducing leakage of transistors N4 and P4 obtaining an overdrive equal to VTL−VTH, thus negative by construction.

In the recovery stage 13, the first transistors, N1 and P1, which are a footer and a header transistor, may have a high threshold voltage VT value to ensure a good stability of the receiver circuit 12 during long periods without transitions. The leakage current charge on the receiver node RX (in the operating point when there are no edges) is equal to:

$$Icharge = IPullUp - IPullDown$$

wherein IPullUp and IPullDown are the currents flowing throughout the pull-up (P1, P2, P3) or pull-down (N1, N2, N3) branches of the recovery stage, respectively.

In particular, when the receiver node RX is set high, the first PMOS transistor P1 is ON and the second PMOS transistor P2 is OFF so that the IPullUp is the leakage current of this second PMOS transistor P2 that is a low VT transistor.

In a same manner, when the receiver node RX is set low, the first PMOS transistor P1 is OFF and the second PMOS transistor P2 is ON so that the IPullUp current is the leakage current of this first PMOS transistor P1 that is a high VT transistor.

Moreover, when the receiver node RX is set high, the second NMOS transistor N2 is ON and the first NMOS transistor N1 is OFF so that the IPullDown current is the leakage current of this first NMOS transistor N1 that is a high VT transistor.

In a same manner, when the receiver node RX is set low, the second NMOS transistor N2 is OFF and the first NMOS transistor N1 is ON so that the IPullDown current is the leakage current of this second NMOS transistor N2 that is a low VT transistor.

From the above relations, if the receiver node RX is high, the IPullUp current is greater than the IPullDown current of some orders of magnitude, tending to bring higher the voltage value on the receiver node RX, avoiding receiver's commutation due to leakage.

In a same manner, if the receiver node RX is low, the IPullUp current is smaller than the IPullDown current of some orders of magnitude, tending to bring lower the voltage value on the receiver node RX, avoiding receiver's commutation due to leakage.

As for the transmitter circuit 11, as previously indicated, it is a simple NAND gate and, during transmission, it works just like an inverting buffer.

During an initialization phase, the reset signal TX-reset is low and enables the transmitter electrodes to go to Vcc.

During reset operations, the receiver electrode is usually biased at 0.9V from a couple of low-leakage polarization transistors (not shown in FIG. 3 since conventional). The receiver node RX is not precharged at Vcc, in order to have almost the same operating condition with respect to a standard communication phase, avoiding the need for over-sized electrodes for the first signal propagation.

In an embodiment of the present invention, the asynchronous interconnection system 10 is realized by a manufacturing process able to provide transistors with two thresholds, in such a way properly ensuring the stability of the system as a whole.

Figure 1:
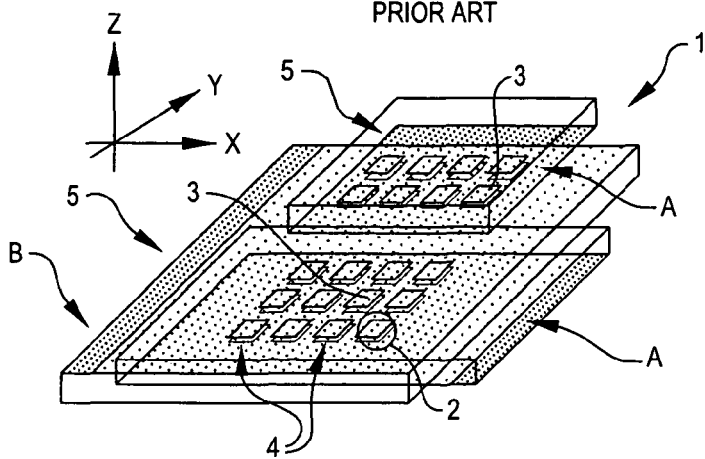
FIG. 1 shows a chip-to-chip interconnection system realized according the prior art.
Figure 2:
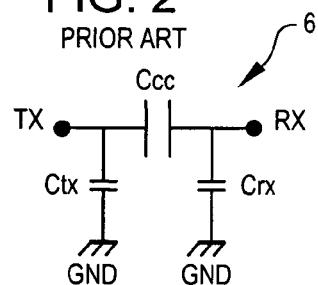
FIG. 2 shows a channel model of an interconnection system according the prior art.
Figure 4:
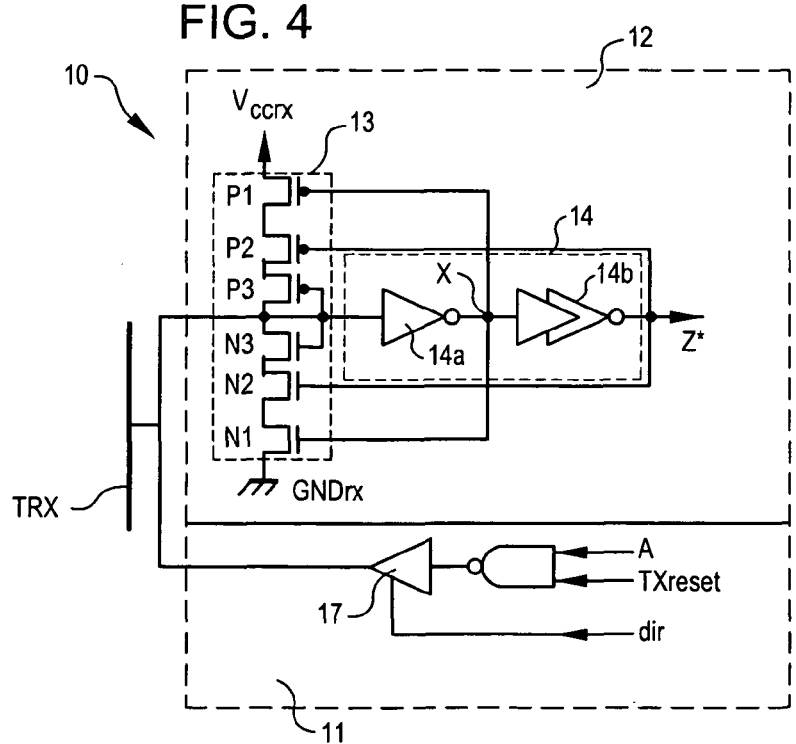
FIG. 4 shows an alternative embodiment of the asynchronous interconnection system according to the present invention.

The asynchronous interconnection system 10 could be also used in case of a bidirectional application, as schematically shown in FIG. 4. In this case, the transmitter and receiver circuit 11 and 12 are connected to each other at a common electrode TRX.

According to an embodiment of the invention, the transmitter circuit 11 further comprises a tristate buffer 17 which is connected to the common electrode TRX, in particular it is inserted between an output terminal of the NAND gate and the common electrode TRX and is enabled by an enabling signal dir.

More particularly, by such an enabling signal dir, the tristate buffer 17 and thus the transmitter circuit 11 is disabled in a reception mode so that the recovery stage 13 recovers a proper voltage level of the common electrode TRX.

Moreover, the signal recovering stage 14b also introduces a delay for the feedback paths.

In summary, according to an embodiment of the present invention, an asynchronous interconnection system is proposed, such a system comprising a transmitter circuit, formed by a buffer stage, and a receiver circuit, in turn including a cascade of inverters and a double feedback loop in order to be able to recover a received voltage signal and to guarantee that the receiver node then translates to a high impedance state.

According to an embodiment of the invention, the proposed receiver circuit may be also used in case of a bidirectional application.

The transmitter 11 and/or receiver 12 of FIGS. 3 and 4 may be disposed on a first integrated circuit such as a controller, which may be coupled to a second integrated circuit, such as a memory, to form a system such as a computer system. The second integrated circuit may be disposed to the same or a different die as the first integrated circuit. Furthermore, the second integrated circuit may also include the transmitter 11 and/or receiver 12 of FIGS. 3 and 4.

The invention claimed is:

1. An asynchronous interconnection system comprising a transmitter circuit and a receiver circuit inserted between respective first and second voltage references and having respective transmitter and receiver nodes coupled in a capacitive manner, said receiver circuit comprising:
   a recovery stage inserted between said first and second voltage references of said receiver circuit and connected to said receiver node; and
   a state control stage, in turn inserted between said first and second voltage references of said receiver circuit, connected to said recovery stage correspondence with a first feedback node providing a first control signal and having a second feedback node connected in a feedback manner to said recovery stage.
   said recovery stage comprising a first feedback loop connected to said first feedback node and acting in such a way to recover a received voltage signal and a second feedback loop connected to said second feedback node and acting in such a way to deactivate the recovery feedback on said receiver node and guarantee that said receiver node is set in a high impedance state.

2. The asynchronous interconnection system according to claim 1, whenever said recovery stage comprises a first and a second pair of complementary voltage recovery transistors, inserted between said first and second voltage references of said receiver circuit and having their control terminals connected to said first and second feedback nodes.

3. The asynchronous interconnection system according to claim 1, wherein said transmitter circuit comprises a buffer stage of the NAND type inserted between said first and second voltage references of said transmitter circuit and having a reset terminal which receives a transmitter reset signal.

4. The asynchronous interconnection system according to claim 3, wherein said transmitter circuit comprises a first and a second buffer transistor inserted, in parallel to each other, between said first voltage reference of said transmitter circuit and said transmitter node, as well as a third and a fourth buffer transistor inserted, in series to each other, between said transmitter node and said second voltage reference of said transmitter circuit, said first and third buffer transistors having their control terminals connected to each other and to an input terminal of said transmitter circuit, while said second and fourth buffer transistors have their control terminals connected to said reset terminal.

5. An asynchronous interconnection system comprising a transmitter circuit and a receiver circuit inserted between respective first and second voltage references and having respective transmitter and receiver nodes coupled in a capacitive manner, said receiver circuit comprising:
- a recovery stage inserted between said first and second voltage references of said receiver circuit and connected to said receiver node; and
- a state control stage, in turn inserted between said first and second voltage references of said receiver circuit, connected to said recovery stage correspondence with a first feedback node providing a first control signal and having a second feedback node connected in a feedback manner to said recovery stage;
- said recovery stage comprising a first feedback loop connected to said first feedback node and acting in such a way to recover a received voltage signal and a feedback loop connected to said second feedback node and acting in such a way to deactivate the recovery feedback on said receiver node and guarantee that said receiver node is set in a high impedance state;
- whenever said recovery stage comprises a first and a second pair of complementary voltage recovery transistors, inserted between said first and second voltage references of said receiver circuit and having their control terminals connected to said first and second feedback nodes; and
- wherein said recovery stage comprises a first and a second voltage recovery transistor of the PMOS type inserted, in series to each other, between said first voltage reference (Vccrx) of said receiver circuit and said receiver node as well as a first and a second voltage recovery transistor of the NMOS type inserted, in series to each other, between said receiver node and said second voltage reference of said receiver circuit, said first voltage recovery transistors having respective control terminals connected to each other and to said first feedback node and forming said first couple of complementary voltage recovery transistors and said second voltage recovery transistors having respective control terminals connected to each other and to said second feedback node and forming said second couple of complementary voltage recovery transistors.

6. The asynchronous interconnection system according to claim 5, wherein said first feedback node provides said control terminals of said first voltage recovery transistors with said first control signal, while said second feedback node provides said control terminals of said second voltage recovery transistors with a second control signal.

7. The asynchronous interconnection system according to claim 6, wherein said state control stage comprises a signal amplification stage and a signal recovering stage interconnected at said first feedback node, said signal recovering stage being further connected to said second feedback node.

8. The asynchronous interconnection system according to claim 7, wherein said state control stage comprises a plurality of inverters inserted, in cascade to each others, between said first and second feedback nodes and comprising respective couples of complementary transistors connected between said first and second voltage references and having common terminals connected to intermediate nodes and in that a first inverter of said plurality of inverters is connected to said receiver node and forms said signal amplification stage and the other inverters of said plurality of inverters form said signal recovering stage), a last inverter being connected to said second feedback node.

9. The asynchronous interconnection system according to claim 8, wherein each inverter of said plurality of inverters comprises a first and a second transistors of the PMOS and NMOS type, respectively, connected, in series to each other, between said first and second voltage references and have control terminals connected to each other and to said receiver node and common drain terminals connected to an intermediate node.

10. The asynchronous interconnection system according to claim 8, wherein said first inverter comprises an inverting amplification stage.

11. The asynchronous interconnection system according to claim 7, further comprising a voltage limiter, inserted within said recovery stage and connected to said receiver node.

12. The asynchronous interconnection system according to claim 11, wherein said voltage limiter comprises a pair of complementary transistors inserted between said second voltage recovery transistors of said recovery stage, connected to said receiver node and having control terminals connected to said receiver node as well.

13. The asynchronous interconnection system according to claim 12, wherein said second voltage recovery transistors of said recovery stage and said complementary transistors of said voltage limiter are transistors with a low value of their threshold voltage.

14. The asynchronous interconnection system according to claim 13, wherein said first voltage recovery transistors of said recovery stage and the transistors of said plurality of inverters of said state control stage are transistors with a high value of their threshold voltage.

15. An asynchronous interconnection system comprising a transmitter circuit and a receiver circuit inserted between respective first and second voltage references and having respective transmitter and receiver nodes coupled in a capacitive manner, said receiver circuit comprising:
- a recovery stage inserted between said first and second voltage references of said receiver circuit and connected to said receiver node; and
- a state control stage, in turn inserted between said first and second voltage references of said receiver circuit, connected to said recovery stage correspondence with a first feedback node providing a first control signal and having a second feedback node connected in a feedback manner to said recovery stage;
- said recovery stage comprising a first feedback loop connected to said first feedback node and acting in such a way to recover a received voltage signal and a feedback loop connected to said second feedback node and acting in such a way to deactivate the recovery feedback on said receiver node and guarantee that said receiver node is set in a high impedance state;
- wherein said receiver circuit further comprises a biasing stage connected to a reset terminal which receives a receiver reset signal.

16. An asynchronous interconnection system comprising a transmitter circuit and a receiver circuit inserted between respective first and second voltage references and having respective transmitter and receiver nodes coupled in a capacitive manner, said receiver circuit comprising:
- a recovery stage inserted between said first and second voltage references of said receiver circuit and connected to said receiver node; and
- a state control stage, in turn inserted between said first and second voltage references of said receiver circuit, connected to said recovery stage correspondence with a first feedback node providing a first control signal and having a second feedback node connected in a feedback manner to said recovery stage;
- said recovery stage comprising a first feedback loop connected to said first feedback node and acting in such a way to recover a received voltage signal and a feedback loop connected to said second feedback node and acting in such a way to deactivate the recovery feedback on said receiver node and guarantee that said receiver node is set in a high impedance state;
- wherein said transmitter circuit comprises a buffer stage of the NAND type inserted between said first and second voltage references of said transmitter circuit and having a reset terminal which receives a transmitter reset signal;
- wherein said transmitter circuit comprises a first and a second buffer transistor inserted, in parallel to each other, between said first voltage reference of said transmitter circuit and said transmitter node, as well as a third and a fourth buffer transistor inserted, in series to each other, between said transmitter node and said second voltage reference of said transmitter circuit, said first and third buffer transistors having their control terminals connected to each other and to an input terminal of said transmitter circuit, while said second and fourth buffer transistors have their control terminals connected to said reset terminal;
- wherein, in case of a bidirectional application, said transmitter circuit and said receiver circuit are connected to each other at a common electrode and in that said transmitter circuit further comprises a tristate buffer, which is in turn connected to said common electrode and is enabled by an enabling signal, such a tristate buffer being disabled in a reception mode.

17. The asynchronous interconnection system according to claim 16, wherein said signal recovering stage also introduces a delay for the feedback paths of the receiver circuit.

18. A receiver, comprising:
- an input node operable to receive an input signal that transitions from a first signal level to a second signal level;
- an output node;
- an output stage coupled to the output node; and
- an input stage coupled between the input node and the output stage, operable to be engaged to drive the input node toward a third signal level in response to the transitioning of the input signal, and operable to be disengaged to cease driving the input node toward the third signal level the disengaging occurring a first period of time after the transitioning of the input signal, the third signal level being different from the first signal level and different from the second signal level.

19. The receiver of claim 18 wherein the first, second, and third signal levels respectively comprise first, second, and third voltage levels.

20. The receiver of claim 18 wherein:
- the output stage is operable
  - to generate an input-recovery signal in response to the transitioning of the input signal, and
  - to generate a halt-recovery signal in response to the input-recovery signal; and
- wherein the input stage is operable
  - to drive the input node toward the third signal level in response to the input-recovery signal, and
  - to cease driving the input node toward the third signal level in response to the halt-recovery signal.

21. The receiver of claim 18 wherein the second signal level is equal to the third signal level or is between the first and third signal levels.

22. The receiver of claim 18, further comprising:
- a reference node; and
- wherein the input stage is operable
  - to drive the input node toward the third signal level by coupling the input node to the reference node, and
  - to cease driving the input node toward the third signal level by uncoupling the input node from the reference node.

23. The receiver of claim 18, wherein:
- the input node is operable to receive the input signal transitioning from the second signal level to the first signal level; and
- the input stage is operable to drive the input node toward a fourth signal level in response to the transitioning of the input signal from the second to the first signal level, and operable to cease driving the input node toward the fourth signal level a second period of time after beginning to drive the input node toward the fourth signal level, the fourth signal level being different from the second signal level.

24. The receiver of claim 23 wherein the first, second, and fourth signal levels respectively comprise first, second, and fourth voltage levels.

25. The receiver of claim 23 wherein:
- the output stage is operable
  - to generate an input-recovery signal in response to the transitioning of the input signal from the second to the first signal level, and
  - to generate a halt-recovery signal in response to the input-recovery signal; and
- wherein the input stage is operable
  - to drive the input node toward the fourth signal level in response to the input-recovery signal, and
  - to cease driving the input node toward the fourth signal level in response to the halt-recovery signal.

26. The receiver of claim 23 wherein the first signal level is equal to the fourth signal level or is between the second and fourth signal levels.

27. The receiver of claim 23, further comprising:
- a reference node; and
- wherein the input stage is operable
  - to drive the input node toward the fourth signal level by coupling the input node to the reference node, and
  - to cease driving the input node toward the fourth signal level by uncoupling the input node from the reference node.

28. An integrated circuit, comprising:
- an external node operable to receive an input signal that transitions from a first signal level to a second signal level; and
- a receiver, comprising
  - an input node coupled to the external node,
  - an output node, an output stage coupled to the output node, and an input stage coupled between the input node and the output stage, operable to be activated to drive the input node toward a third signal level in response to the transitioning of the input signal, and operable to be deactivated a first period of time after the transitioning of the input signal to cease driving the input node toward the third signal level, the third signal level being different from the first signal level and different from the second signal level.

29. The integrated circuit of claim 28, further comprising a receiving circuit coupled to the output node of the receiver.

30. The integrated circuit of claim 28, further comprising a transmitter operable to generate an output signal on the external node.

31. The integrated circuit of claim 28, further comprising:
a pin; and
wherein the external node is coupled to the pin.

32. A system, comprising:
a first integrated circuit, comprising,
    a first external node operable to receive an input signal that transitions from a first signal level to a second signal level; and
    a receiver, comprising
        an input node coupled to the external node,
        an output node,
        an output stage coupled to the output node, and
        an input stage coupled between the input node and the output stage, operable to be engaged to drive the input node toward a third signal level in response to the transitioning of the input signal, and operable to be disengaged to cease driving the input node toward the third signal level the disengaging occurring a first period of time after the transitioning of the input signal, the third signal level being different from the first signal level and different from the second signal level; and
a second integrated circuit coupled to the first integrated circuit.

33. The system of claim 32 wherein one of the first and second integrated circuits comprises a controller.

34. The system of claim 32 wherein the first and second integrated circuits are disposed on a same die.

35. The system of claim 32 wherein the first and second integrated circuits are disposed on respective dies.

36. The system of claim 32 wherein the second integrated circuit:
comprises a second external node that is coupled to the first external node of the first integrated circuit; and
is operable to generate the input signal on the second external node.

37. The system of claim 32 wherein the second integrated circuit:
comprises a second external node that is capacitively coupled to the first external node of the first integrated circuit; and
is operable to generate the input signal on the second external node.

38. A receiver, comprising:
receiver input and output nodes;
a first reference node;
an input stage coupled to the receiver input node and comprising
    a first transistor coupled to the first reference node,
    a second transistor coupled between the first transistor and the receiver input node; and
    a third transistor coupled between the second transistor and the receiver input node and having a control node coupled to the receiver input node; and
an output stage comprising
    a first buffer coupled to the input stage and to a control node of one of the first and second transistors, and
    a second buffer coupled between the first buffer and the receiver output node and coupled to a control node of the other of the first and second transistors.

39. The receiver of claim 38 wherein the first and second transistors respectively comprise first and second PMOS transistors.

40. The receiver of claim 39 wherein the input stage further comprises a third PMOS transistor coupled between the second transistor and the receiver input node and having a control node coupled to the receiver input node.

41. The receiver of claim 38 wherein the first and second transistors respectively comprises first and second NMOS transistors.

42. The receiver of claim 41 wherein the input stage further comprises a third NMOS transistor coupled between the second transistor and the receiver input node and having a control node coupled to the receiver input node.

43. The receiver of claim 38 wherein:
the first buffer is coupled to the control node of the first transistor; and
the second buffer is coupled to the control node of the second transistor.

44. The receiver of claim 38 wherein:
the first buffer has an output node that is coupled to the control node of the first transistor; and
the second buffer has an output node that is coupled to the control node of the second transistor.

45. The receiver of claim 38 wherein:
the first buffer comprises a first inverter that is coupled to the control node of the first transistor; and
the second buffer comprises a second inverter that is coupled to the control node of the second transistor.

46. The receiver of claim 38 wherein:
the first buffer comprises a first inverter that has an output node that is coupled to the control node of the first transistor; and
the second buffer comprises a second inverter that has an output node that is coupled to the control node of the second transistor.

47. The receiver of claim 38, further comprising:
a second reference node;
wherein the input stage further comprises
    a third transistor coupled to the second reference node, and
    a fourth transistor coupled between the third transistor and the receiver input node;
wherein the first buffer is coupled to a control node of one of the third and fourth transistors; and
wherein the second buffer is coupled to a control node of the other of the third and fourth transistors.

48. The receiver of claim 47 wherein the input stage further comprises a fifth transistor coupled between the fourth transistor and the receiver input node and having a control node coupled to the receiver input node.

49. The receiver of claim 47 wherein:
the first and second transistors respectively comprise first and second PMOS transistors; and
the third and fourth transistors respectively comprise first and second NMOS transistors.

50. The receiver of claim 47 wherein:
the first buffer is coupled to the control node of the third transistor; and
the second buffer is coupled to the control node of the fourth transistor.

51. The receiver of claim 47 wherein:
the first buffer has an output node that is coupled to the control node of the third transistor; and
the second buffer has an output node that is coupled to the control node of the fourth transistor.

52. The receiver of claim 47 wherein:
the first buffer comprises a first inverter that has an output node that is coupled to the control node of the third transistor; and
the second buffer comprises a second inverter that has an output node that is coupled to the control node of the fourth transistor.

53. The receiver of claim 38 wherein:
the first transistor comprises a first MOS transistor having a first threshold voltage; and
the second transistor comprises a second MOS transistor having a second threshold voltage that is lower than the first threshold voltage.

54. A method, comprising:
pulling an input node toward a first signal level in response to an input signal on the input node transitioning from a second signal level to a third signal level, the first signal level being different than the second signal level and different from the third signal level; and
reducing a pulling current to the input node, the reducing not starting until after a delay time that is after the input node transitioning from a second signal level to a third signal level.

55. The method of claim 54 wherein pulling the input node comprises coupling the input node to the first signal level in response to the transitioning of the input signal.

56. The method of claim 55 wherein reducing the pulling current comprises uncoupling the input node from the first signal level.

57. The method of claim 54 wherein reducing the pulling current comprises increasing an impedance between the input node and a source of the first signal level.

58. The method of claim 54, further comprising receiving the input signal at the input node substantially via a capacitive path.

59. The method of claim 54, further comprising:
generating a first feedback signal in response to the transitioning of the input signal;
generating a second feedback signal in response to the first feedback signal;
wherein pulling the input node comprises pulling the input node in response to the first feedback signal; and
wherein reducing the pulling current comprises reducing the pulling current in response to the second feedback signal.

* * * * *

UNITED STATES PATENT AND TRADEMARK OFFICE
CERTIFICATE OF CORRECTION

PATENT NO. : 7,821,293 B2
APPLICATION NO. : 12/006102
DATED : October 26, 2010
INVENTOR(S) : Alberto Fazzi et al.

It is certified that error appears in the above-identified patent and that said Letters Patent is hereby corrected as shown below:

In Claim 1, Column 8, Line 51 of the patent, "to said recovery stage." should read
-- to said recovery stage; --

In Claim 11, Column 10, Line 26 of the patent, "said recovery stage and connected to said receive node ." should read -- said recovery stage and connected to said receiver node. --

Signed and Sealed this
Twenty-second Day of March, 2011

David J. Kappos
*Director of the United States Patent and Trademark Office*